(12) United States Patent
Russell

(10) Patent No.: US 7,730,375 B1
(45) Date of Patent: Jun. 1, 2010

(54) METHOD AND APPARATUS FOR CONTROLLING OPERATING MODES OF AN ELECTRONIC DEVICE

(76) Inventor: Robert J. Russell, 297 K St., South Boston, MA (US) 02127

( * ) Notice: Subject to any disclaimer, the term of this patent is extended or adjusted under 35 U.S.C. 154(b) by 221 days.

(21) Appl. No.: 11/768,092

(22) Filed: Jun. 25, 2007

Related U.S. Application Data

(60) Provisional application No. 60/864,406, filed on Nov. 5, 2006.

(51) Int. Cl.
G01R 31/3177 (2006.01)
G01R 31/42 (2006.01)
(52) U.S. Cl. ......................... 714/733; 714/718
(58) Field of Classification Search ............. None
See application file for complete search history.

(56) References Cited

U.S. PATENT DOCUMENTS 4,488,111 A * 12/1984 Widdowson ............ 324/762
6,128,758 A * 10/2000 Hall et al. ............... 714/727
2006/0242499 A1* 10/2006 Volz ...................... 714/724

* cited by examiner

Primary Examiner—Kevin L Ellis
Assistant Examiner—Dipakkumar Gandhi

(57) ABSTRACT

A method and apparatus allows externally selecting a functional operation mode or one of a plurality of test operation modes of an electronic device, and in particular a volatile or non-volatile memory device, without the need for additional device connections. One variation of the method and apparatus allows unlimited switching between modes. Another variation of the method and apparatus limits test operation mode selection except at the time of powering up of the device. In either variation, mode selection is based on internally detected stimulus externally applied to the device that would not be present during normal functional operation of the device. Operation of the present invention is essentially transparent in applications where test operations are not utilized, making a device incorporating the present invention compatible with previous versions of the device where the present invention and test operation modes, such as IEEE P1581 and BIST, were not included.

18 Claims, 5 Drawing Sheets

METHOD AND APPARATUS FOR CONTROLLING OPERATING MODES OF AN ELECTRONIC DEVICE

CROSS-REFERENCE TO RELATED APPLICATIONS/DOCUMENTS

The present application is related to the copending U.S. non-provisional patent application bearing application Ser. No. 11/222,474 filed Sep. 7, 2005, titled "Method and Apparatus for Enabling and Disabling a Test Mode of Operation of an Electronic Memory Device without Additional Interconnects or Commands" published Mar. 9, 2006 as Publication number 20060053358. The present application is also related to the copending U.S. non-provisional patent application bearing application Ser. No. 11/761,815 filed Jun. 12, 2007, titled "Method and Apparatus for Controlling Operating Modes of an Electronic Device." The present application is further related to the following U.S. provisional applications: U.S. provisional application No. 60/813,134 titled "Method and Apparatus for Controlling Operating Modes of an Electronic Device" filed Jun. 12, 2006 and U.S. provisional application No. 60/814,133 titled "Method and Apparatus for Controlling Operating Modes of an Electronic Device" filed Jun. 17, 2006. The present application claims priority of U.S. provisional application No. 60/864,406 titled "Method and Apparatus for Controlling Operating Modes of an Electronic Device" filed Nov. 5, 2006. Also, the present application claims priority of earlier filed U.S. disclosure document 602,438 titled "Method and Apparatus for Controlling Operating Modes of an Electronic Device—Additions" filed Jun. 20, 2006. This application incorporates by reference the above referenced U.S. non-provisional and provisional applications and disclosure document.

BACKGROUND OF THE INVENTION

1. Field of Use

The present invention relates to the field of electronic testing and, in particular, to the testing of printed circuit boards (PCBs) and to writable memory devices, volatile or non-volatile, and other devices that may be mounted thereon. The invention more particularly relates to testing for proper connections to other parts of the PCB, testing for and accessing device identification data contained within the devices and for controlling built-in self test (BIST) and self-repair of those devices.

2. Related Art

The benefits of being able to test for proper connection between the various devices mounted on PCBs has long been recognized as beneficial both in fault detection and diagnosis. That is, while testing the PCB as a functional unit is important in itself, there are advantages to separately testing the interconnects, especially in PCB designs in which the functionality is complex. Such designs are sometimes referred to as being comprised of random logic, because the challenge of testing differs from that of more straightforward designs, such as is the case with, for example, main memory units. In the latter type, the same or similar clusters of logical functions may exist in, perhaps, over a hundred instances. Additionally, these clusters of logical functions may be the same or similar to those functions which have existed in digital computers for decades and for which tests have been developed and perfected over time.

Various methods have been developed to address the testing challenges of interconnect testing. One such method is termed "boundary scan," where a secondary layer of logic (test logic) is added to the primary layer of logic (functional logic) of each boundary scan device and controlled by extra connections to the device. IEEE Standard 1149.1 defines a method of boundary scan widely used in the industry. IEEE Standard 1149.1 was developed as a refinement of an international industry effort termed "Joint Test Action Group" (JTAG). Presently, the term JTAG is also used to refer both to devices which are IEEE Standard 1149.1 compliant and devices which may not be in strict compliance to the standard. The term IEEE 1149.1 will be used herein to include both classes of devices (i.e., strictly compliant and not strictly compliant).

IEEE 1149.1 devices incorporate three or four extra test input connections (TDI, TCK, TMS or TDI, TCK, TMS, TRST*, respectively) to control the internal device test logic. Such a device operates in either a functional operation mode or a test operation mode, depending on the signals received at those test input connections and upon the time interval since the device was powered up. That is, it is a norm that IEEE 1149.1 devices with only the three extra test inputs are designed to achieve a completely functional (non-test) state within a given interval after power up. It should be noted that the term "state of a device" is used herein to refer to which logical layer is controlling the non-IEEE 1149.1 outputs of the device. That is, in the test state, the boundary scan layer controls most device outputs, whereas in the functional device state, the functional logic layer controls most device outputs. An exception is the single IEEE 1149.1 output connection (TDO), which is always controlled by the test logic. Most non-IEEE 1149.1 input connections are usually connected to the test logic for level sensing. Exceptions may be power and high-speed clock inputs. The extra IEEE 1149.1 connections (TDO, TDI, TCK, TMS and optional TRST*) are termed a "Test Access Port."

While the IEEE 1149.1 capability has been included on many complex devices, such as microprocessors and the like, many simple devices, such as separate groups of AND or OR gates, for example, are not available in IEEE 1149.1 versions. In the case of such simple devices, the added IEEE 1149.1 logic might be more complex than the functional logic of the device. Also, the simple logic paths that these devices provide between more complex devices are often easily testable by means of the IEEE 1149.1 circuitry extant in those complex devices and automatic test pattern generation (ATPG) software commonly used to write IEEE 1149.1 test patterns. The decision not to include IEEE 1149.1 logic in a device is made by the device manufacturer, as a marketing choice. That is, for example, the manufacturer decides whether or not the additional cost of an IEEE 1149.1 version of a device will be sufficiently welcomed in the market.

Memory devices have largely fallen into the category of devices which do not incorporate IEEE 1149.1 circuitry. Reasons for manufacturer decisions not to include IEEE 1149.1 may be the extremely competitive nature of the memory device industry, the inherent propagation delay, however minor, of adding any circuitry to the functional connections and the PCB etch routing problems imposed by the IEEE 1149.1 interconnects. There may be other reasons, as well, including what may possibly be the main reason manufacturers do not include IEEE 1149.1 circuitry on most memory devices: the nature of PCB designs incorporating one or more clusters of those devices. A main memory PCB of a computer is an example of a cluster of memory devices. In some key respects, the designs of clusters of memory devices are very similar to those of the past and can be tested by test programs very similar to those developed over decades. These test programs generally have high fault detection and fault diagnosis capabilities. Hence, there is less overall economic advantage to be gained by adding IEEE 1149.1 circuitry to memory devices in comparison to adding it to microprocessors, for example, by the device manufacturer.

In memory device applications other than clustered applications, interconnect testing is often extremely difficult. That is, unless the memory device contains IEEE 1149.1 circuitry, its connection to one or more devices which do may not solve the test problem. For example, in a case where the memory device operation has timing requirements which cannot be met by boundary scan operations, such testing may be impossible. To address such problems, another standard has been proposed, IEEE Standard P1581 (hereinafter referred to as IEEE P1581). As with IEEE 1149.1, an IEEE P1581 device would have both a test operation mode and a functional operation mode. However, the circuitry used in the IEEE P1581 test operation mode would be much less complex than the circuitry required for IEEE 1149.1. The circuitry may be simple gates such as AND, NAND, OR, NOR, XOR and XNOR, connected between device inputs and outputs in predetermined patterns, although more complex logic functions, such as storage elements, are not precluded from use. These logic functions enable signals from IEEE 1149.1 circuitry in another device or devices to propagate through the memory device and stimulate inputs of the same or other IEEE 1149.1 devices. The use of simple gating in IEEE P1581 means there is a minimum of extra circuitry involved in the memory devices, although the economy of circuitry has little apparent relative effect on the cost of device fabrication because of the small size of either type of test circuit (i.e., IEEE 1149.1 vs. IEEE P1581) in comparison to the functional circuitry of a memory of substantial size. The principal benefit of IEEE P1581 as originally proposed, absent the benefit of the invention of the cross referenced related applications, is that only one extra connection to the device is needed to select test operation mode or functional operation mode. In certain memory devices, there may even be one or more combinations of control input signals which serve no functional purpose. In such instances, one or more such control input signal combinations may be used to set or reset the test operation mode, obviating extra connections. Memory devices having such unused control input signal combinations, however, are the exception rather than the rule. Therefore, incorporating the originally proposed IEEE P1581 capability into a device will commonly require an otherwise unnecessary connection to the device. Even this single added connection will sometimes be considered by suppliers as presenting a marketing disadvantage in main memory applications, which represents the largest market for many memory devices and where, as stated, the test advantage of IEEE P1581 is somewhat diminished because of the availability of adequate test methods which work well without the IEEE P1581 test circuitry.

The ability to externally access and read the contents of a read-only register within a device which is programmed during device manufacture with a thereafter unalterable code is also considered very beneficial. When included in the device, this capability may represent the only means by which important variations in the basic design of a device may be detected in a practical way during test operations once the device manufacturing process is complete and, to an even greater extent, when the device has been connected to other devices on a PCB. An example of such a register is the 32-bit Device Identification Register included in IEEE 1149.1 devices, although non-IEEE 1149.1 identification schemes involving lesser or greater numbers of bits may be used to advantage.

The benefits of Built-In Self Test (BIST) and self-repair have also long been recognized. BIST may be conveniently controlled by means of the IEEE 1149.1 test access port. Self-repair, a method whereby extra sections of a device may be substituted for sections determined to be faulty, either automatically or via external commands, also may utilize the IEEE 1149.1 test access port for convenience. That is, a degree of inconvenience results when BIST and self-repair are controlled by other means. This is usually because extra connections to the device are required, along with other hardware external to the device.

The invention described in the inventor's first referenced related patent application, application Ser. No. 11/222,474 filed Sep. 7, 2005, allows operating mode control of volatile memory devices which, by their nature, need have no functional purpose between the application of power and the time data is first written into them. In devices designed according to that invention, test operation mode begins at power up and ends at the beginning of the first write. Although valuable for its unique ability at the time to allow P1581 testing in a device having no extra connections or unused control codes, that invention does not include a provision for device identification, BIST or self-repair and is of minimal value in non-volatile writable memory applications, where data written prior to the previous power down may need to be accessed before the first write after the current powering up. Also, the inventor's first referenced related patent application may be impractical for use with test equipment having certain pattern application and/or test flow constraints. Additionally, the inventor's first referenced related patent application has no provision to return to test operation mode once functional operation mode has been invoked without powering the memory device down and then up, an operation which may be impractical, for example, because of additional hardware requirements to do so without cycling power to the entire PCB, or because of additional requirements of either or both of the PCB hardware or test software if the entire PCB is to be powered down and then up.

The inventor's second referenced related patent application deals with performing and switching between various test operations in a device in which a test operation mode of operation has already been established without requiring additional device connections beyond any connections that might have been used to establish the test operation mode.

SUMMARY OF THE INVENTION

It is an object of the present invention to provide entry means whereby one or more test operation modes of operation of a device may be entered from the functional operation mode of the device, said entry means requiring no device connections beyond those necessary for functional operation of the device.

It is another object of the present invention to provide exit means whereby a device operating in one or more test operation modes of operation may exit to enter another test operation mode of operation of the device or to enter the functional operation mode of operation of the device, said exit means requiring no additional device connections beyond those necessary for functional operation of the device.

It is yet another object of the present invention to provide entry means whereby one or more test operation modes of operation may be entered from the power off state of the device, said entry means requiring no additional device connections beyond those necessary for functional operation of the device.

It is still yet another object of the present invention to be usable with IEEE P1581 or non-P1581 devices which include device identification, BIST and self-repair operations in any combination in addition to continuity test operations.

It is even still yet another object of the present invention to provide at least one means of operation that is compatible with test equipment having certain pattern or test flow constraints.

The above and other objects of the present invention are achieved in an illustrated embodiment of a method and apparatus which may be included in a layer of test logic in a logical device and, in particular, in a logical memory device.

The method and apparatus of the present invention utilizes externally selected non-functional stimulus as later described in establishing any one of a number of test modes of operation for an electronic device. More specifically, a selected connection to the device is monitored by the device for the occurrence of a non-functional stimulus, whereupon the device is caused to enter a test mode of operation. Optionally, in the case where the device is designed to operate in a number of test operation modes, other selected connections can be used to select a particular test operation mode.

The present invention takes advantage of common PCB and device design practices wherein certain possible signal activity on certain connections between the PCB and device is or may be suppressed or ignored during given intervals. In one such design practice, for example, a prudent PCB designer might ensure the signals or combination of signals used to initiate write activity to memory devices are made to be inactive immediately after power up, thus avoiding unwanted data writes. That is, the PCB is designed such that spurious activity which may occur after power is applied to the PCB will not cause a memory write. This is especially important when non-volatile memory devices are used, since important data stored before the previous power down might otherwise be inadvertently overwritten. Similarly, in another example design practice, a prudent memory device designer might ensure writing is disabled between the time power is first applied to the memory device, and presumably to the PCB on which the memory device may be mounted, and the time it can reasonably be expected all spurious PCB activity which may occur directly after power up should have ended. In another such PCB and memory device design practice, signal activity on address lines is suppressed during write operations by the PCB logic controlling the address lines and ignored by the device logic monitoring the address lines, except during one or more defined intervals at either or both transitions of the write activity control signal or group of signals. In many cases, the action of suppressing or ignoring such address activity is simply the result of design convenience, such as clocking the address between registers, as opposed to being an otherwise inconvenient design practice.

That is not to say all PCBs and memory devices suppress and ignore, respectively, signal activity on address lines during write operations in the periods not within specified intervals. However, there customarily being no functional benefit to PCB circuitry causing such address activity, nor benefit from memory device circuitry monitoring and reacting to such address activity, it is reasonable to classify such activity as "Non-Functional Stimulus" (NFS). That is, such activity has no beneficial purpose relating to normal functionality of the memory device. Similarly, write activity immediately after power up, as stated in the first example may be classified as a form of NFS.

For the purposes of the present invention, Non-Functional Stimulus may be said to include any signal activity which can be reasonably expected neither to interfere with nor improve the functional operation of the memory device, or other electronic device, to which the present invention is applied, within the limitations of reasonable PCB usage of the device. That is, while cases may exist where signal activity defined as NFS herein may interfere with memory device operation in certain PCB applications of the memory device, such cases will be exceptions, avoidable by minor PCB design adjustments if indeed such cases are found to exist at all. For example, if a memory device of the type shown in FIG. 2 incorporating the present invention is designed such that the WE* signal being active for longer than fifty milliseconds is taken as NFS, it is possible that no existing PCB designs or future PCB design plans will be negatively impacted, since WE* signal activity is seldom as long as a microsecond in modern designs. Signals having a duration of longer than fifty milliseconds are readily generated using boundary scan test equipment and incircuit testers.

The present invention utilizes external application of Non-Functional Stimulus to cause an electronic memory device, or other electronic device, to enter one or more test operation modes. Circuitry designed according to the teachings of the present invention contained within the memory device or other device monitors stimulus at predetermined device input connections and recognizes predetermined stimulus characteristics to be those characteristics which circuitry external to the device is designed to generate when a test operation mode is to be activated. For devices having more than one test operation mode, circuitry within the device may be designed to secondarily monitors one or more other device connections for the presence of other activity, not necessarily of an NFS nature, sensed in conjunction with the primarily monitored connection, logic levels being usually sufficient for such secondarily monitored device connections.

It is important to note the present invention does not necessarily require circuitry designed to be capable of detecting more than one form of NFS at more than one device connection. In most cases, the ability of device NFS detection circuitry to detect one form of NFS at one device connection will suffice. The NFS characteristics and device connection listed in the device specification, along with any secondarily monitored connections, will be used by the PCB or other external circuitry designer in generating the appropriate stimulus to cause the device to enter one of perhaps several test modes.

For example, in a memory device incorporating one variation of the present invention, write activity is monitored as soon as power up stability has been achieved. If write activity is sensed, the test operation mode is entered. That is, the immediate write activity is the NFS that will cause test operation mode entry. If no activity is sensed, the functional operation mode is entered and the test operation mode is thereby prevented from occurring until the next power up occurs. Thus, in the latter case, the PCB and test designers may determine to utilize the memory device in what is sometimes termed "legacy" operating mode: the memory operates in the manner of an equivalent device, but absent the test capability. To invoke a test operation mode at power up, the PCB and/or test program designer need only ensure that an otherwise meaningless write activity occurs.

In another such design practice, PCB address and control signals to a memory device possess certain timing and sequence characteristics during memory operations. For example, the write enable signal to the memory device would never remain active for as long as, say, fifty milliseconds, nor would address lines change state while the write signal was active. In such a case, a write enable signal remaining active for longer than fifty milliseconds might be used as NFS. In this example, it is assumed actual completion of the write operation after a switch to test operation mode would be a matter of design choice, allowing the mode switch to be optionally carried out without altering device contents. In yet another design practice, the clock signal to a memory device requiring such an input from the PCB would always be held to be within a given frequency tolerance and any value outside that tolerance could be considered NFS. The NFS possibilities among the signal connections to modern memory devices are essentially unbounded. For example, even in the case of a ROM device having only address inputs and data outputs, where signal timing is unlimited, an analog level may be used, for example on the low order address connection, as NFS to be generated on the PCB and sensed within the ROM device.

Therefore, in light of the teachings of the present invention, those skilled in the art may devise numerous methods to switch between functional and test operation modes of a memory device without additional device connections. That is, it is simply a matter of choosing, as part of the device design process, an unusual stimulus to be detected within the device, and generating such a signal on or external to the PCB on which the device is mounted when mode switching is desired. In addition to generating and detecting unusual stimulus at one device connection to switch from device functional operation to device test operation, one or more standard levels may be simultaneously applied at one or more other device connections to select between a plurality of test operation modes, each having different characteristics. For example, in the previously stated example of a fifty millisecond write pulse, a given logic level applied and detected at a preselected address input connection could be used to cause a switch from device functional operation to device continuity test operation mode operation, whereas application of the opposite logic level under the same conditions could be used to cause a switch from device functional operation to device combined BIST, self-repair and device identification test operation mode operation. Note that combining BIST, self-repair and device identification operations within one test operation mode of operation may be possible because such operations may be carried out using only a subset of the possible combinations of input stimulus applied and detected at device input connections, whereas the continuity test operation mode of operation may require all such combinations, absent the teaching of the inventor's second referenced related patent application.

In some cases, variations of the unusual stimulus applied and detected a single device input may be used to select among various test operation modes. For example, a clock input where a frequency applied and detected is between a given low and high rate may be used to cause the device to operate in the functional operation mode of operation, whereas applying and detecting a frequency lower than the given low may be used to cause a first test operation mode and applying and detecting a frequency higher than the given high may be used to cause a second test operation mode. Note that unambiguous detection of analog signal characteristics such as voltage or frequency usually requires the characteristic to be detected for a given minimum period.

Regardless of the unusual stimulus or combination of unusual and standard stimulus chosen as part of the device design process to cause switching from functional operation mode to one or more test operation modes, returning to functional operation mode or switching to another test operation mode can be accomplished using one or more combinations of standard signal levels applied to control the various steps of a given test operation. For example, during continuity test operations, a logic one applied to a given group of the device input connections while a logic zero was applied to another given group of device input connections could be used to switch from test continuity operation mode to functional operation mode, whereas applying logic zeroes and ones, respectively, to the said groups of device input connections could be used to switch from test continuity operation mode to a test operation mode combining BIST, self-repair and device identification operations.

Once the memory device is in any test operation mode, device outputs are controlled by a layer of test logic. The functional layer, the layer that performs the legacy operating mode functions in a device not incorporating the present invention and related test operation mode control apparatus and methods, is usually designed to ignore external inputs which could inadvertently alter memory contents or otherwise interfere with testing. When the device is in a test operation mode, the functional layer does not control device output drivers, other than indirectly in some optional test operations which may be used to examine the logic of the functional layer.

The layer of test logic may include sections to support (1) IEEE P1581 or similar continuity functions, (2) device identification functions, (3) BIST functions or (4) self-repair functions. Other sections may also be included as needs arise. It should be noted that the term "layer" has been used herein for ease in distinguishing between the test and functional logical sections of a device and not to suggest a limitation imposed by the present invention and related test mode control apparatus and methods on the physical design and manufacturing process of the device.

Certain aspects of the present invention were also described in the inventor's paper titled "Enhanced Transparent Test Mode" electronically distributed to IEEE P1581 mailing list recipients Jun. 26, 2006, which is herein incorporated by reference. Certain other aspects of the present invention were also described in the inventor's paper titled "Enhanced Transparent Test Mode Test Mode Control Details" electronically distributed to IEEE P1581 mailing list recipients Sep. 5, 2006, which is also herein incorporated by reference.

It should be further noted that the stated applicability of the present invention and related test mode control apparatus and methods to volatile or non-volatile memory devices is not intended to preclude its applicability to devices having combined volatile and non-volatile characteristics.

It should be even further noted that the teachings of the present invention in utilizing unusual stimulus are not limited by the examples given. One skilled in the art will be able to use these teachings to advantage in recognizing other unusual stimulus which may be used in test operation mode entry, test operation mode switching or functional operation mode switching without departing from the teachings of the present invention.

DESCRIPTION AND OPERATION OF THE ILLUSTRATED EMBODIMENT

Figure 1:
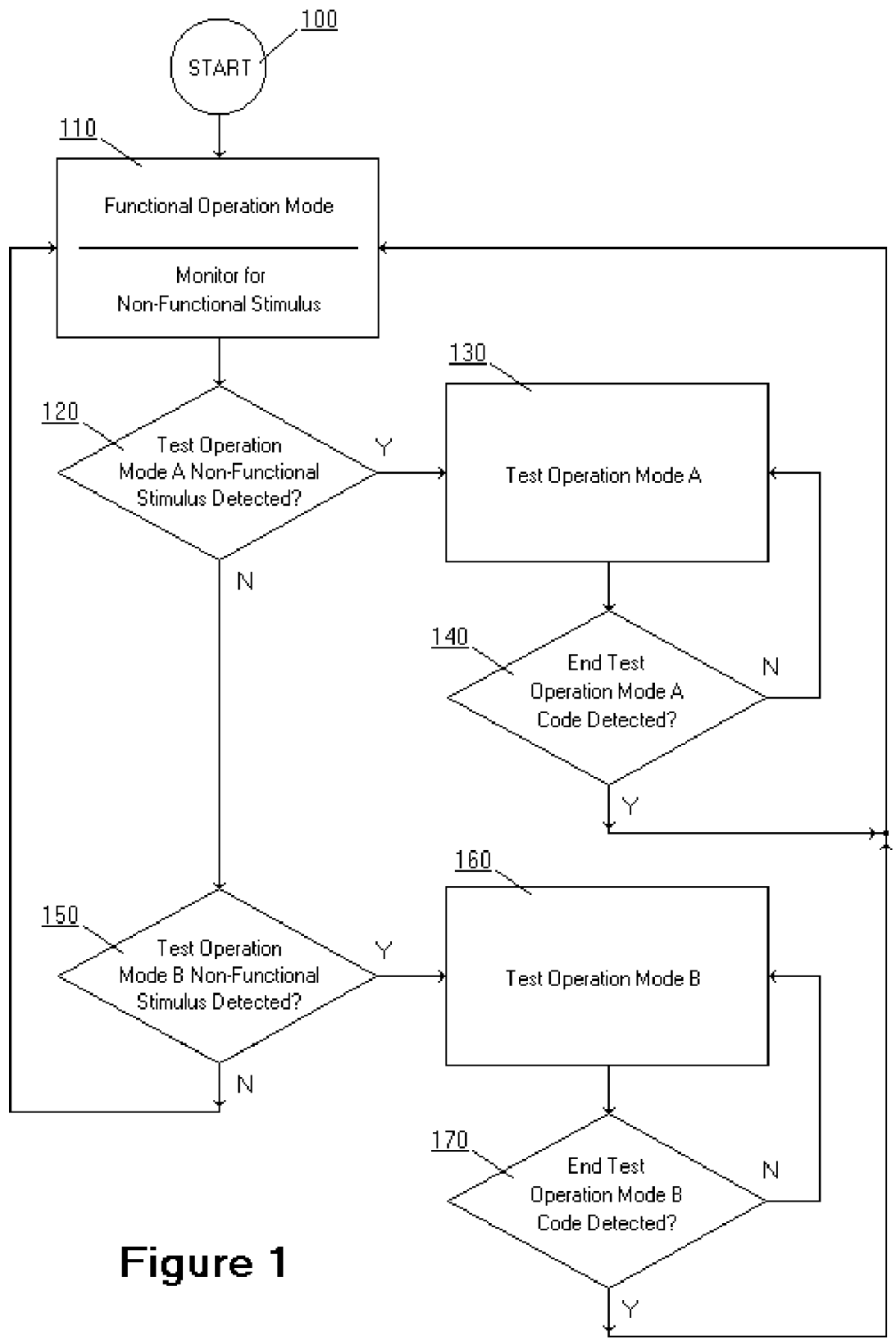
FIG. 1 is a flow chart showing one example method of the present invention of switching back and forth between functional operation mode and a plurality of test operation modes of an electronic memory device having no external device connections beyond those necessary for controlling the stated functional operation mode.

With reference to FIGS. 1 through 5, the principles of the present invention will now be described relative to their application to a particular device and system incorporating any chosen test operation modes, said device having no external connections nor unused control codes beyond those necessary for functional operation. For ease of understanding, no distinction will be made in the following description of the present invention between its applicability to a device mounted on a PCB versus a section of a device contained within a device. Since FIG. 1 is best understood in light of the explanations of FIGS. 2 through 5, they will be explained first.

Figure 2:
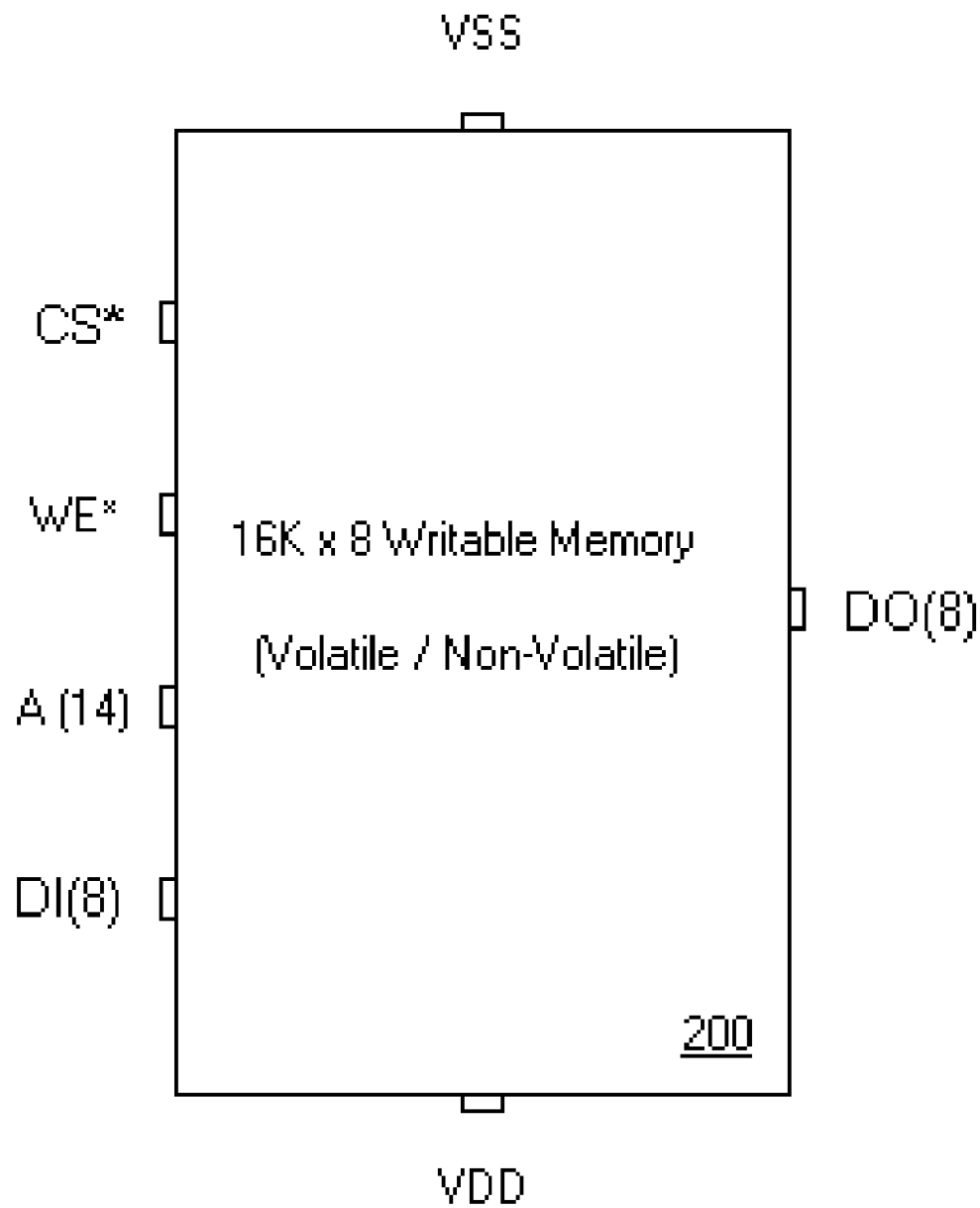
FIG. 2 is a symbolic representation of the memory device of FIG. 3.
Figure 3:
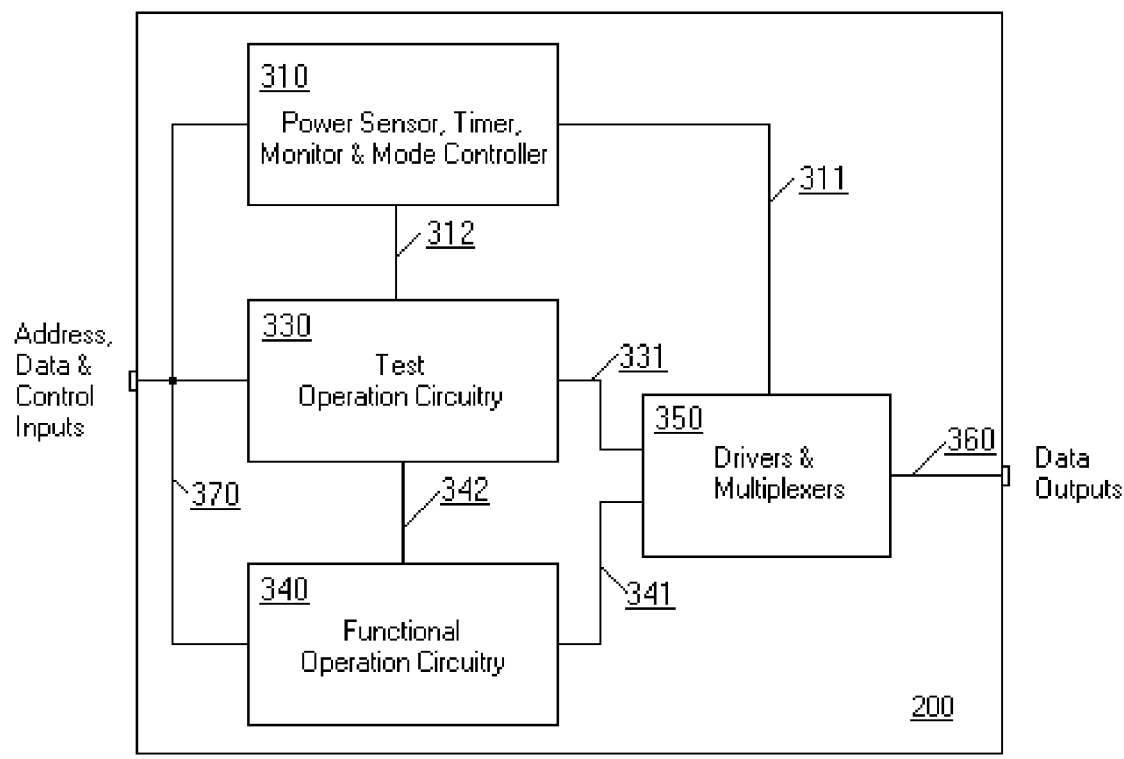
FIG. 3 is a block diagram showing the various sections of a device incorporating the present invention and related test mode apparatus and methods.

The memory device 200 shown in FIGS. 2 and 3 is a TTL 16,384×8 memory device having 34 connections: CS*, WE*, fourteen address inputs labeled A(14), eight data inputs labeled DI(8), eight data outputs labeled DO(8), and two power connections labeled VSS and VDD. There are no extra connections included to activate or deactivate test operation mode or functional operation mode. Also, in functional operation mode, all possible combinations of logic input states of the memory device have a defined purpose, aside from the Non-Functional Stimulus concept previously discussed. Therefore, there is no extra state or command available in functional operation mode which may be used exclusively for test purposes, such as for activating or deactivating test operation mode without effecting the functional circuitry. Other devices to which the memory device incorporating the present invention may be connected are not shown in FIGS. 2 and 3.

Memory device 200 is assumed to be non-volatile: data written is retained both in the presence and absence of power. It is important to note that non-volatility of the device is not a requirement for operation with the present invention, but was chosen for inclusion in this description because it represents the more difficult case. The present invention is applicable both to volatile and non-volatile devices.

The operation of the functional operation mode of memory device 200 will now be described in general terms so as to make its operation understandable to those familiar with such devices. The description does not include all details, such as timing details, which might be included in a datasheet of the device but which are not necessary to an understanding of the operation of the present invention. In the device of FIG. 2, CS* is a negative enabled chip select. When CS* is a logic zero, the outputs are driven and writing to the memory is permitted. When CS* is a logic one, the output drivers are in a high impedance state and writing is prevented. When WE* transcends from a logic zero to a logic one in conjunction with CS* being a logic zero, the data present at the 8 data inputs DI is written into the memory address A present at the 14 address inputs. In functional operation mode, CS* being low causes the eight outputs DO to be driven with the contents of the memory location selected by the address present at the fourteen A inputs. In test operation mode, CS* being low causes the outputs to be driven by the test circuitry.

The illustrated embodiment will now be described with reference to FIG. 3.

Figure 5:
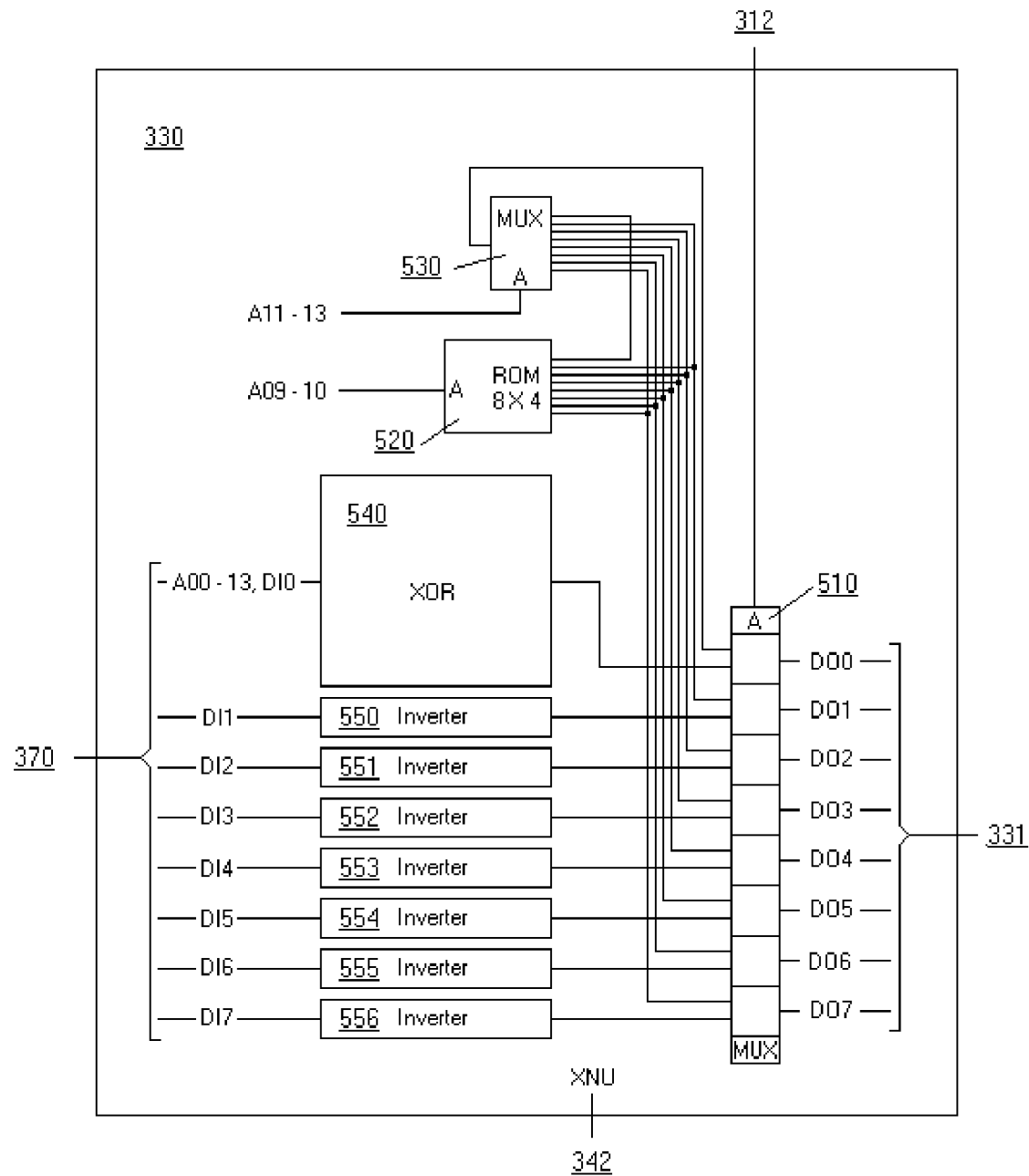
FIG. 5 shows examples of circuitry of two test operation modes that might be entered and exited in a device incorporating the present invention.

FIG. 3 illustrates in greater detail the memory device of FIG. 2. As shown, device 200 has inputs 370. Inputs 370 are connected to circuit 310, which includes a power sensor, a 10 millisecond timer for use in power sensing, one or more other timers for use in NFS detection, monitor circuits and control circuits which control both the overall operating mode (test or functional) and other circuitry of the present invention. The principal function of the control circuitry of circuit 310 is as a mode controller. The connections to VDD and VSS used in powering circuit 310 and as inputs to the power sensor section of circuit 310 are not shown. Circuit 310 connects to drivers and multiplexers circuit 350 by means of lines 311. Lines 311 are used to control the selection of test circuitry outputs (via lines 331) or functional circuitry outputs (via lines 341) as inputs to the device drivers contained within block 350 and to control the strength of device 200 drivers. The strength may optionally be reduced when memory device 200 is operating in test operation mode. This strength control should not be confused with the control means by which driver outputs assume a high impedance state. Lines 360 connect the data output drivers of block 350 to the external data output connections of memory device 200. Also shown in FIG. 3 are test circuits 330 and functional circuits 340, which are each connected to the device inputs via lines 370. Lines 312 and lines 342 are used for control and data transfer between control circuits 310, test circuits 330 and functional circuitry 340. Lines 342 are necessary only in certain test operation mode implementations. For example, lines 342 would not be needed in a case where test operation modes were continuity test operation mode and test device identification mode, as illustrated in FIG. 5 where lines 342 within block 330 are marked as unused (XNU).

Although not part of the present invention and related test mode control apparatus and methods, an example of two test operation mode circuits will now be described as an aid to understanding the application of the present invention in a memory device. As shown in FIG. 5, the test operation circuitry 330 has a total of 22 address and data inputs and 8 data outputs. For continuity test operation mode operation, seven of those 22 inputs are passed through inverters 550 through 556 before being passed on to seven of the eight sections of multiplexer 510. The remaining 15 of those 22 inputs are connected to the inputs of 15 input XOR gate 540, the output of which is connected to the eighth section of multiplexer 510. The logic states of each of the eight multiplexer 510 inputs from XOR gate 540 and inverters 550 through 556 will each be transferred to the respective outputs of multiplexer 510 upon applying a predetermined logic state to the multiplexer 510 address input A. When the opposite logic state is applied to multiplexer 510 address input A, the logic states at the outputs of ROM 520 and multiplexer 530 connected to the remaining eight inputs of multiplexer 510 are each transferred to one of the outputs of multiplexer 510, the outputs labeled DO0 through D07, making up lines 331. ROM 520, controlled by device address inputs A09 and A10, and multiplexer 530, controlled by device address inputs A11 through A13, are the additional test circuitry needed to provide test device identification operation mode operation. The relationship of the circuitry shown in FIG. 5 to continuity testing and device identification will be readily apparent to those familiar with IEEE P1581 and IEEE 1149.1.

The present invention and related test mode control apparatus and methods are included in memory device 200 in addition to the circuitry necessary for the device to perform its normal function. That is, the additional test circuitry of the device is intended to be utilized only during specific test operations on the PCB. Once the tests have been completed, the additional test circuitry becomes essentially transparent so that the normal functionality of the device exists, for practical purposes, in the same form as a like device absent the test circuitry. An exception to this is self repair circuitry, if incorporated in the device, which continues to substitute for defective functional circuitry, preventing otherwise erroneous operation. Also, the outputs of the device during test operation mode may be designed to have less than normal drive strength so as to minimize or eliminate possible problems that might exist when numerous such devices are connected together on a bus and the external signals necessary to prevent such conflicts have not been invoked or do not exist. While the application of the present invention has been described as intended to be as an addition to memory devices, it may be used to benefit in other devices as well to provide testing benefit in certain circumstances.

For purposes of the current explanation, "test operation mode" refers to a mode of operation where the device outputs are controlled by the test circuitry of the device and where the functional circuitry of the device is controlled only by the test circuitry. That is, the functional circuitry of the device ignores all direct external stimulus when the device is not in "functional operation mode." Thus, for example, the functional circuitry of device 200, when in test operation mode, will not, when the input conditions exist to write data D in address A, write data D into address A, as it would if the device had been in functional operation mode.

It is also important to note that one goal of the present invention is that a device incorporating the present invention does not interfere with the functional operation of a PCB design where the test operation mode is not intended to be utilized. That is, when the PCB designer has chosen not to utilize the test benefits of a device incorporating the present invention, no special stimulus to the device will be required to prevent the test operation mode from interfering with PCB operation other than to ensure, for example in the case of the test operation mode entry method used in FIG. 4, the write function not is activated at power up and for a short period thereafter, a normal PCB operating characteristic and one which may usually be easily included when designing a PCB. In some cases, the device designer may prefer to utilize input functions other than or in addition to the write function as the means of causing the device to operate in test operation mode. That is, the write function or other predetermined combination of input signals may be considered a "test code" for selecting one or more device test operation modes shortly after power up. Thus, a device incorporating the present invention will be able to be utilized interchangeably in PCBs which utilize a test operation mode and PCBs which do not.

The method of operation of a device incorporating the present invention included on a PCB which has not been designed to take advantage of test operation mode will now be described with reference to FIG. 4. The beginning point of the flow chart is starting point 400. The power off state of the PCB and the device is depicted by box 410. When power is applied, standard power sensing circuitry within the device is able to detect when power has reached a state at which it may be considered within limits and stable, as depicted by the looping path in decision box 420. The circuitry to perform this task is known to those familiar with the art and is discussed, for example, in IEEE 1149.1. Such a step may not be necessary where power stability is reliably achieved with insignificant delay after power up is initiated.

Once power is sensed as being stable, box 430 is entered and a nominal delay executed. In the illustrated embodiment, the delay is ten milliseconds, although longer or shorter delays may be designed into other embodiments and included as a device specification. The purpose of the delay is to allow circuitry external to the device, and perhaps even external to the PCB on which the device is mounted, time to stabilize. Following the delay and upon entry into decision box 440, the input states of the device inputs which are used to cause entry into test operation mode A are examined. Since the PCB design in this example case precludes such states to exist shortly after power up, decision box 460 will be entered. Since the PCB design further precludes the states necessary to cause entry into test operation mode B to exist shortly after power up, the flow continues to box 480, wherein functional operation mode is entered and continues until device power is removed. Therefore, the device operates in the same manner as a device having like functional operational mode characteristics, but in which the present invention has not been incorporated. This example of operation shows that a device incorporating the present invention, when mounted on a PCB which has been properly designed to suppress spurious writes or other predetermined control signals immediately after power up, but where utilization of the device test operation mode is not desired, will behave for practical purposes as if it did not incorporate the test operation mode capability usable with the present invention and related test mode control apparatus and methods. This allows mixing devices which incorporate the present invention and related test mode control apparatus and methods with those that do not in populating a PCB.

Figure 4:
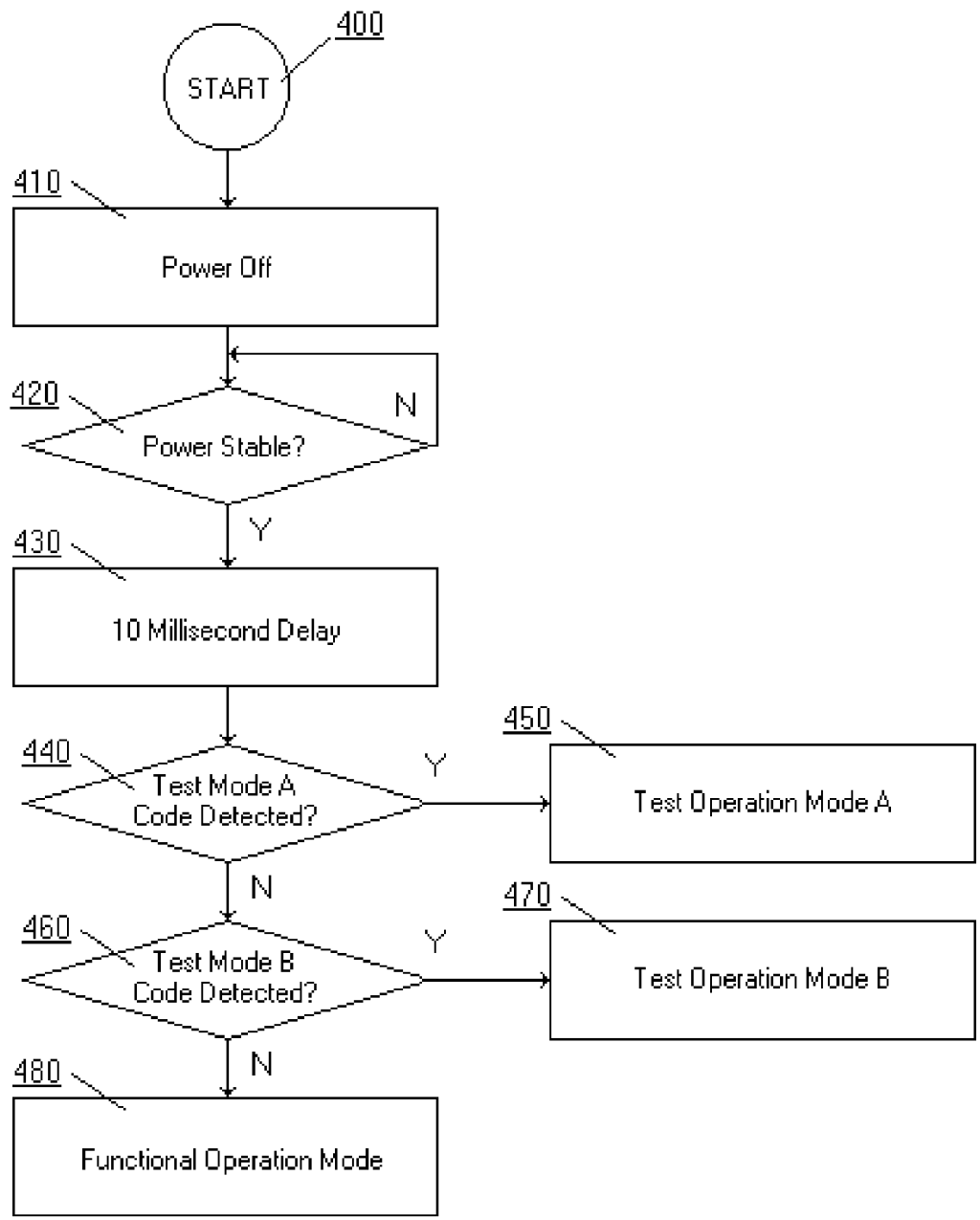
FIG. 4 is a flow chart showing one example method of the present invention of selectively entering one of a plurality of test operation modes directly after power is applied to the device.

FIG. 4 will now be utilized to explain one method of test operation mode control and operation of a device incorporating the present invention included on a PCB which has been designed to take advantage of the present invention. Starting at starting point 400, operation will be the same as described in the previous case (test operation mode not utilized) until box 440 is reached. Then, assuming the proper test code is detected (for example, WE* active and A00 at a logic zero state) due to proper PCB and/or test design, the flow will continue to box 450, where a test operation mode of one type (shown as Mode A) will be entered. Had A00 been a logic one state in decision box 440, flow would have continued to decision box 460, where assuming WE* active and A00 at logic one were the conditions under which the device was designed to enter a test operation mode of a second type (shown as Mode B) would have been entered. If the conditions for test operation mode entry were not met in either decision box 440 or decision box 460, the flow would have continued to box 480 the entry point for functional operation mode.

In the example of FIG. 4, operation boxes 450, 470 and 480 show no exit. That is, any of the three operation modes, once entered, continue until power is removed from the device. This is not a limitation of this method of the present invention. That is, it would have been possible to utilize input stimulus to switch between various test operation modes, once established, and between those modes and functional operation mode. Furthermore, it would have been possible during a test operation mode to set conditions for reactivating a test operation mode once functional operation mode had been entered. An example of a reactiviation method would be through a timeout circuit, though other methods will be evident to one skilled in the art. In some cases, the inability of a device to leave the functional operation mode, once entered will be a considered a desirable safeguard. In other cases, the inability to switch between modes will not be considered a significant limitation, as, for example, when test operation modes are included in a device for use only during device testing prior to mounting the device on a PCB.

FIG. 1 will now be utilized to explain another method of test operation mode control and operation of a device incorporating the present invention included on a PCB which has been designed to take advantage of the present invention. Starting at starting point 100, the flow continues to box 110, the device being in functional operation mode as a result of power having been just previously applied. (In the method of FIG. 1 there is no option of being in other than functional operation mode directly after power has been applied.) To be more easily understandable, the example of FIG. 1 will be explained in the case where the present invention has been included in a memory device of the type shown in FIG. 2, which additionally includes two test operation mode circuits as shown in FIG. 5 and where the test continuity operation mode is selected when Non-Functional Stimulus of WE* activity of greater than fifty milliseconds is detected simultaneously with a logical zero level of address input A00, the detection circuitry for both being included within block 310 of FIG. 3. When the logic level of A00 is a logical one level under the same conditions, the test device identification operation mode is selected.

Continuing with the example of FIG. 1, the monitor action of box 110 is shown in decision boxes 120 and 150. It should be noted that the device functional operation mode is not interrupted as long as the flow remains within the loop of box 110 and decision boxes 120 and 150. In this example, it will be assumed the Test Operation Mode A of box 130 is a test continuity operation mode and the Test Operation Mode B of box 160 is a test device identification mode. If the stated WE* NFS is found to be present along with a logic zero level at input A00, box 130 will be entered. Circuitry within block 310 of FIG. 3 will force lines 312 to a state where multiplexer 510 of FIG. 5 selects the logic values of the outputs of the continuity test circuitry, XOR 540 and inverters 550 through 556, to be applied to lines 331 and, then, to lines 360 by virtue of control lines 311 and the drivers and multiplexers of block 350, as previously discussed in the explanation of FIG. 3. Note that although only a single connection is necessary to implement the connection, the term "lines 312" has been used because multiple connections would be required in other implementations of the circuitry of blocks 310 and 330. If, in decision box 120, a logic one level had been sensed at A00, the flow would have continued to decision box 150 and then to box 160. In that case, lines 312 would be forced to the opposite state, and device outputs 360 would be set to the logic values of the outputs of ROM 520 and multiplexer 530, the device identification circuitry.

As further shown in FIG. 1, the test operation modes of box 130 continues until an End Test Operation Mode A Code is detected in decision box 140. As with the monitor function of box 110, previously discussed, the loop consisting of boxes 130 and decision box 140 does not represent an interruption of Test Operation Mode A. The preselected code to end Test Operation Mode A can be any predetermined combination sensed on inputs 370 by circuitry implemented in block 310 of FIG. 3. The circuitry of block 310 of FIG. 3 will then utilize lines 311 to force device outputs 360 to values determined by the functional operation circuitry of block 340 via the connection path of lines 341.

Returning to the explanation of FIG. 1, had Test Operation Mode B in box 160 been entered instead of Test Operation Mode A in box 130, end test detection would have been determined in decision box 170, using any predetermined combination sensed on inputs 370 of block 310 of FIG. 3. Regardless of whichever Test Operation Mode ends (i.e., A or B), the flow is the same, as shown in the paths from decision boxes 140 and 170 in FIG. 1. The Functional Operation Mode of box 110 is entered and remains in effect unless the same process as previously described causes one or the other test operation mode to be entered.

While one skilled in the art will recognize that numerous variations may be made in implementing the teachings of the present invention as shown in the example of FIG. 1, they have been omitted for simplicity of explanation. Such variations include but are not limited to the selection of more than two test modes and the ability to switch between test operation modes without entering the functional operation mode.

From the above it is seen that the present invention and related test mode control apparatus and methods provide a number of advantages over prior methods of PCB testing. For example, no extra connections to the memory device are required beyond those necessary to carry out the normal functional operation of the memory device. A further example is that, Non-Functional Stimulus aside, no special or spare input signal combination codes are required beyond those necessary to carry out the normal functional operation of the memory device. A still further example of the advantages of the present invention and related test mode control apparatus and methods is that the multiple mode operation of the device creates little difference from operation of a device of equivalent functionality, but without the circuitry of the present invention and related test mode control apparatus and methods. Thus, the multiple mode operation of the present invention and related test mode control apparatus and methods is available to users who wish to utilize the test features of the present invention and related test mode control apparatus and methods and is essentially transparent to users who may not only be uninterested in utilizing any test operation modes of the present invention, but are unwilling to incorporate more than minimal, if any, special circuitry external to the device to avoid the effects of activating test operation mode in devices incorporating the present invention and related test mode control apparatus and methods.

It should be noted that, while a block diagram approach has been used to describe the present invention and related test operation mode control apparatus and methods, it will be apparent to those skilled in the art as to the specific circuits required to perform the functions contained within the illustrated blocks.

It will be apparent to those skilled in the art that memory devices designed according to the present invention and related test mode control apparatus and methods may be used to benefit in testing of memory modules connected to other modules such as, for example, mother boards of personal computers. It will also be apparent to those skilled in the art that the method of the present invention is applicable to other devices, for example, memories in which addresses or data are presented to the memory devices in time multiplexed groups, as opposed to all at once as discussed herein.

The invention claimed is:

1. A method of operating an electronic device having a functional operation mode and one or more test operation modes, the method comprising the steps of:
   (a) causing the electronic device to enter the functional operation mode directly after powering up, said electronic device having neither unused external connections nor externally applied functional operation mode control codes unused in controlling the functional operation mode;
   (b) while in the functional operation mode and without interfering with the functional operation mode operations, monitoring one or more predetermined input connections of the electronic device for the presence of predetermined non-functional logic level stimulus;

(c) monitoring one or more other predetermined inputs for other logic level stimulus when the electronic device is designed to operate in more than one test operation mode;

(d) upon detecting predetermined combinations of logic level stimulus in steps (b) and (c), entering a specified one of a number of test operation modes;

(e) operating in the test operation mode entered in step (d) while simultaneously monitoring predetermined inputs of the electronic device for the presence of at least one predetermined logic level stimulus test control code for causing the electronic device to exit operation in the test operation mode entered in step (d); and, (f) then, returning to the functional operation mode.

2. The method of claim 1 wherein step (e) optionally includes at least one predetermined test control code for causing the electronic device to switch to another test operation mode in lieu of returning to the functional operation mode.

3. The method of claim 1 wherein one or more non-functional operation modes include continuity test capability.

4. The method of claim 1 wherein one or more non-functional operation modes include device identification capability.

5. The method of claim 1 wherein one or more non-functional operation modes include built in self test capability.

6. The method of claim 1 wherein one or more non-functional operation modes include self-repair capability.

7. The method of claim 1 wherein the electronic device is an electronic memory device.

8. An apparatus of an electronic device having a functional operation mode and one or more test operation modes, the apparatus comprising:

(a) circuitry for causing the electronic device to enter the functional mode of operation directly after powering up, said electronic device having neither unused external connections nor externally applied functional operation mode control codes unused in controlling the functional operation mode;

(b) circuitry for detecting predetermined logic level stimulus at one or more predetermined external connections of the electronic device, said logic level stimulus detecting circuitry being capable of detecting non-functional logic level stimulus;

(c) circuitry for detecting logic level stimulus at one or more predetermined external connections of the electronic device, said logic level stimulus detecting circuitry being capable of detecting logic level stimulus indistinguishable from functional logic level stimulus;

(d) circuitry for generating an output upon determining the existence of predetermined combinations of logic level stimulus detected by the circuitry designated in (b) and (c); and, (e) circuitry for selectively activating and deactivating test operation mode circuitry of the electronic device in response to one or more outputs of the generating circuitry.

9. The apparatus of claim 8 wherein the electronic device is an electronic memory device.

10. The apparatus of claim 8 wherein test continuity operation mode circuitry is included in the circuitry of one or more non-functional operation modes.

11. The apparatus of claim 8 wherein test device identification operation mode circuitry is included in the circuitry of one or more non-functional operation modes.

12. The apparatus of claim 8 wherein test built-in self test operation mode circuitry is included in the circuitry of one or more non-functional operation modes.

13. The apparatus of claim 8 wherein test self-repair operation mode circuitry is included in the circuitry of one or more non-functional operation modes.

14. The apparatus of claim 8 wherein test operation mode circuitry other than continuity, device identification, built-in self test or self-repair circuitry is included in the circuitry of one or more non-functional operation modes.

15. A method of constructing and operating an electronic device having a functional operation mode and one or more test operation modes, the method comprising the steps of:

(a) selecting one or more external connections of the electronic device which are required to be in one or more select predetermined logic level state combinations before a given period has elapsed after power up to prevent undesired functional operation of the electronic device, said electronic device having neither unused external connections nor externally applied functional operation mode control codes unused in controlling the functional operation mode;

(b) including circuitry for causing the electronic device to operate such that one or more predetermined combinations of logic level states being present at the one or more external connections at the instant the given period has elapsed will cause the electronic device to enter one of the one or more test operation modes of the electronic device; and, (c) externally generating one of the one or more logic level state combinations at the selected one or more external connections before the stated period has elapsed and holding that logic level state combination for a period of time wherein the electronic device is certain to have entered the one of the one or more test operation modes.

16. The method of claim 15 wherein external connections of the electronic device in addition to the external connections of the electronic device used in step (a) determine which of a plurality of non-functional operation modes will be entered.

17. The method of claim 15 wherein the one or more external connections of the electronic device monitored in step (a) are utilized in controlling writing within the electronic device.

18. The method of claim 15 wherein the design of the electronic device determines whether or not any functional operation mode activity will occur upon entry into select one or more non-functional operation modes.

* * * * *